(12) United States Patent
Kim

(10) Patent No.: US 9,818,739 B2
(45) Date of Patent: Nov. 14, 2017

(54) ARRAY SUBSTRATE AND MANUFACTURING METHOD THEREOF, AND A DISPLAY DEVICE

(71) Applicant: BOE TECHNOLOGY GROUP CO., LTD, Beijing (CN)

(72) Inventor: Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/097,536

(22) Filed: Apr. 13, 2016

(65) Prior Publication Data

US 2016/0322346 A1    Nov. 3, 2016

(30) Foreign Application Priority Data

Apr. 28, 2015 (CN) .......................... 2015 1 0209605

(51) Int. Cl.

| | |
|---|---|
| H01L 27/02 | (2006.01) |
| H01L 27/12 | (2006.01) |
| H01L 23/535 | (2006.01) |
| H01L 29/786 | (2006.01) |
| H01L 29/417 | (2006.01) |
| H01L 29/423 | (2006.01) |

(52) U.S. Cl.
CPC ........ *H01L 27/0292* (2013.01); *H01L 23/535* (2013.01); *H01L 27/1222* (2013.01); *H01L 27/1248* (2013.01); *H01L 29/41733* (2013.01); *H01L 29/42384* (2013.01); *H01L 29/786* (2013.01)

(58) Field of Classification Search
CPC .................................. H01L 27/0248–27/0296
See application file for complete search history.

(56) References Cited

U.S. PATENT DOCUMENTS

| | | | |
|---|---|---|---|
| 2009/0153008 A1* | 6/2009 | Yanagisawa | ........ G02F 1/13452 313/51 |
| 2010/0225859 A1* | 9/2010 | Tsai | .................. G02F 1/136213 349/106 |

* cited by examiner

*Primary Examiner* — Peniel M Gumedzoe
*Assistant Examiner* — Christopher Johnson
(74) *Attorney, Agent, or Firm* — Armstrong Teasdale LLP

(57) ABSTRACT

An array substrate is provided. The array substrate includes a substrate body, a gate electrode layer, a first insulating layer, a source-drain electrode layer, a second insulating layer, and a transparent conducting layer, wherein the transparent conducting layer includes a bridging part. The bridging part includes a first electrode, a second electrode, and a connecting electrode, wherein a reference plane is defined perpendicular to the substrate body and passing through the first electrode, the connecting electrode, and the second electrode, and wherein a cross-sectional area of the connecting electrode that is taken perpendicular to the reference plane and taken perpendicular to the substrate body is i) smaller than a cross-sectional area of the first electrode and ii) smaller than a cross-sectional area of the second electrode.

13 Claims, 7 Drawing Sheets

ARRAY SUBSTRATE AND MANUFACTURING METHOD THEREOF, AND A DISPLAY DEVICE

CROSS REFERENCE TO RELATED APPLICATIONS

This application claims priority to China patent application number 201510209605.6, which was filed on Apr. 28, 2015, the disclosure of which is incorporated by reference herein in its entirety.

BACKGROUND

The invention relates to an array substrate and manufacturing method thereof, and a display device.

The array substrate is an important component of the display device, and the array substrate mainly includes a substrate body, a gate electrode layer, a first insulating layer, an active layer, a source-drain electrode layer, a second insulating layer and a transparent conducting layer. Wherein, the pattern in the gate electrode layer may include a gate electrode and a gate electrode line, the pattern in the source-drain electrode layer may include a source electrode, a drain electrode and a data line, and the pattern in the transparent conducting layer may include a pixel electrode.

It is required to electrically connect the pattern in the gate electrode layer with the pattern in the source-drain electrode layer on a plurality of areas of the array substrate, for example electrically connecting the gate electrodes with the source electrodes (or the drain electrodes) of different TFTs (Thin Film Transistor) in a GOA (Gate Driver on Array) unit, electrically connecting a drain electrode with a gate line of a TFT in a GOA unit, and electrically connecting the gate electrodes with the source electrodes (or the drain electrodes) of different TFTs in an electrostatic discharge circuit, and so on. As shown in FIG. 1A, the array substrate includes a substrate body 1 and first insulating layer 3. As shown in FIG. 1A and FIG. 1B, a structure for electrically connecting the pattern in the gate electrode layer with the pattern in the source-drain electrode layer is that the gate electrode layer further includes a gate connecting part 2 which is connected with the pattern to be electrically connected in the gate electrode layer; the source-drain electrode layer further includes a source-drain connecting part 4 which is connected with the pattern to be electrically connected in the source-drain electrode layer; the transparent conducting layer further includes a bridging part 6, wherein one end of the bridging part 6 is connected with the gate connecting part 2 by a via hole, and the other end is connected with the source-drain connecting part 4 by a via hole.

However, the static charges may be easily generated in the procedure of deposition of the second insulating layer 5, and the static charges will accumulate on the source-drain connecting part 4 under the second insulating layer 5 such that a potential difference will occur between the gate connecting part 2 and the source-drain connecting part 4. Since the resistance of the bridging part 6 for electrically connecting the gate connecting part 2 with the source-drain connecting part 4 is relatively low, the flow of the static charges is relatively fast, leading to a ESD (Electro Static Discharge) phenomenon produced between adjacent ends of the gate connecting part 2 and the source-drain connecting part 4 as shown by the dotted circle in FIG. 1.

BRIEF DESCRIPTION

The embodiments described herein provide an array substrate and manufacturing method thereof, and a display device which can prevent the ESD phenomenon produced in the productive process of the array substrate.

In a first aspect, an array substrate is provided. The array substrate includes a substrate body, and a gate electrode layer, a first insulating layer, a source-drain electrode layer, a second insulating layer and a transparent conducting layer which are successively layered on the substrate body, wherein the gate electrode layer includes a gate connecting part, the source-drain electrode layer includes a source-drain connecting part, and the transparent conducting layer includes a bridging part, wherein the bridging part includes a first electrode electrically which is electrically connected with the gate connecting part, a second electrode electrically which is electrically connected with the source-drain connecting part, and a connecting electrode, one end of which is electrically connected with the first electrode, the other end is electrically connected with the second electrode. Taking the plane that is perpendicular to the substrate body and successively passes the first electrode, the connecting electrode and the second electrode as a reference plane, the area of a section that the connecting electrode is perpendicular to the substrate body and perpendicular to the reference plane is smaller than the area of a section that the first electrode is perpendicular to the substrate body and perpendicular to the reference plane, and the area of the section that the connecting electrode is perpendicular to the substrate body and perpendicular to the reference plane is smaller than the area of a section that the second electrode is perpendicular to the substrate body and perpendicular to the reference plane.

In one embodiment, the array substrate further includes a first via hole which runs through the first insulating layer and the second insulating layer and is located above the gate connecting part, wherein the first electrode is electrically connected with the gate connecting part through the first via hole, a second via hole which runs through the second insulating layer and is located above the source-drain connecting part, wherein the second electrode is electrically connected with the source-drain connecting part through the second via hole.

In another embodiment, the source-drain electrode layer further includes a source-drain electrode layer pattern to be connected, which includes a source electrode, a drain electrode and a data line, the second via hole is located above the source-drain electrode layer pattern to be connected, and the source-drain connecting part is a part that is located under the second via hole and surrounding area thereof in the source-drain electrode layer pattern to be connected.

In another embodiment, the gate electrode layer further includes a gate electrode layer pattern to be connected, which includes a gate electrode and a gate line, the first via hole is located above the gate electrode layer pattern to be connected, and the gate connecting part is a part that is located under the first via hole and surrounding area thereof in the gate electrode layer pattern to be connected.

In another embodiment, the size of the connecting electrode along a first direction is 50 μm~10000 μm, and the size of the connecting electrode along a second direction is 1 μm~6 μm, by taking, on a plane parallel to the substrate body, the direction parallel to the reference plane as the first direction and the direction perpendicular to the reference plane as the second direction.

In another embodiment, the array substrate further includes a third insulating layer covering the transparent conducting layer; a third via hole which runs through the third insulating layer and is located above the first electrode, a fourth via hole which runs through the third insulating layer and is located above the second electrode, a compensating electrode located on the third insulating layer, wherein one end of the compensating electrode is electrically connected with the first electrode through the third via hole, and the other end is electrically connected with the second electrode through the fourth via hole.

In a second aspect, a manufacturing method of an array substrate is provided. The method includes forming a gate electrode layer, a first insulating layer, a source-drain electrode layer, and a second insulating layer by successively layering them on a substrate body, wherein the gate electrode layer includes a gate connecting part, the source-drain electrode layer includes a source-drain connecting part. The manufacturing method further includes forming a transparent conducting layer on the second insulating layer, the transparent conducting layer including a bridging part, wherein the bridging part includes a first electrode which is electrically connected with the gate connecting part, a second electrode which is electrically connected with the source-drain connecting part, and a connecting electrode, one end of which is electrically connected with the first electrode, the other end is electrically connected with the second electrode. Taking the plane that is perpendicular to the substrate body and successively passes the first electrode, the connecting electrode and the second electrode as a reference plane, the area of a section that the connecting electrode is perpendicular to the substrate body and perpendicular to the reference plane is smaller than the area of a section that the first electrode is perpendicular to the substrate body and perpendicular to the reference plane, and the area of the section that the connecting electrode is perpendicular to the substrate body and perpendicular to the reference plane is smaller than the area of a section that the second electrode is perpendicular to the substrate body and perpendicular to the reference plane.

In one embodiment, after forming the second insulating layer and before forming the transparent conducting layer, the manufacturing method further includes forming a first via hole and a second via hole, wherein the first via hole runs through the first insulating layer and the second insulating layer and is located above the gate connecting part such that the first electrode is electrically connected with the gate connecting part through the first via hole, and the second via hole runs through the second insulating layer and is located above the source-drain connecting part such that the second electrode is electrically connected with the source-drain connecting part through the second via hole.

In another embodiment, the source-drain electrode layer further includes a source-drain electrode layer pattern to be connected, which comprises a source electrode, a drain electrode and a data line, the forming the second via hole includes forming the second via hole above the source-drain electrode layer pattern to be connected such that a part that is located under the second via hole and surrounding area thereof in the source-drain electrode layer pattern to be connected is the source-drain connecting part.

In another embodiment, the gate electrode layer further includes a gate electrode layer pattern to be connected, which includes a gate electrode and a gate line, the forming the first via hole includes forming the first via hole above the gate electrode layer pattern to be connected such that a part that is located under the first via hole and surrounding area thereof in the gate electrode layer pattern to be connected is the gate connecting part.

In another embodiment, the manufacturing method further includes covering a third insulating layer on the transparent conducting layer; forming a third via hole and a fourth via hole, wherein the third via hole runs through the third insulating layer and is located above the first electrode, and the fourth via hole runs through the third insulating layer and is located above the second electrode; forming a compensating electrode on the third insulating layer, wherein one end of the compensating electrode is electrically connected with the first electrode through the third via hole, and the other end is electrically connected with the second electrode through the fourth via hole.

In a third aspect, a display device including the above array substrate is provided.

In the array substrate and manufacturing method thereof, and the display device described herein, the bridging part for connecting the gate connecting part with the source-drain connecting part includes the first electrode, the connecting electrode and the second electrode which are connected successively, wherein the first electrode is electrically connected with the gate connecting part, the second electrode is electrically connected with the source-drain connecting part, by causing the area of a section that the connecting electrode is perpendicular to the substrate body and perpendicular to the reference plane (it is perpendicular to the substrate body and run successively through the first electrode, the connecting electrode and the second electrode) to be smaller than the area of a section that the first electrode is perpendicular to the substrate body and perpendicular to the reference plane, and to be smaller than the area of a section that the second electrode is perpendicular to the substrate body and perpendicular to the reference plane, it can increase the resistance of the connecting electrode with respect to the prior art according to an inverse proportionality relationship between a resistance value of a resistance wire and an area of section of the resistance wire, and then increase the resistance of the whole bridging part, therefore it can enhance the blocking effect of the bridging part on the electrostatic charges, slow down the flow speed of the electrostatic charges within the bridging part, and effectively prevent the ESD phenomenon produced in the productive process of the array substrate when the electrostatic charges accumulating at the source-drain connecting part results in a potential difference generated between the source-drain connecting part and the gate connecting part.

BRIEF DESCRIPTION OF THE DRAWINGS

In order to illustrate the embodiments described herein more clearly, the accompanying drawings for use in the description of the embodiments described herein will hereinafter be described briefly. It is obvious that the accompanying drawings described below are only example embodiments.

Figure 1A:
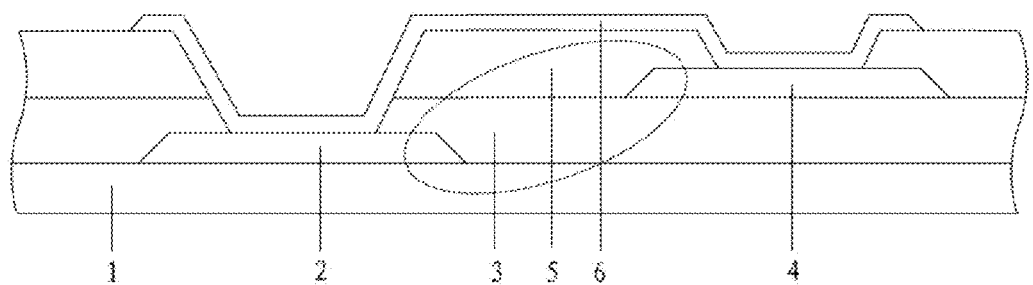
FIG. 1A is a sectional view showing electrically connecting a pattern in a gate electrode layer and a pattern in a source-drain electrode layer on an array substrate in the prior art.

The following is a list of reference numerals and corresponding components, as shown and described in connection with the example embodiments described herein.

1—a substrate body; 2—a gate connecting part;
3—a first insulating layer; 4—a source-drain connecting part;
5—a second insulating layer; 6—a bridging part;
61—a first electrode; 62—a second electrode;
63—a connecting electrode; 7—a first via hole;
8—a second via hole; 9—a third insulating layer;
10—a compensating electrode; 11—a third via hole;
12—a fourth via hole;
13—a source-drain electrode layer pattern to be connected;
14—a metal layer;
R1R2—a reference plane;
OX1—a first direction;
OX2—a second direction;
L—a size of the connecting electrode along the first direction;
W—a size of the connecting electrode along the second direction;
A1'A2'—a section orientation of the first electrode perpendicular to the reference plane;
A1"A2"—a section orientation of the second electrode perpendicular to the reference plane.

DETAILED DESCRIPTION

To make the features and advantages of the disclosure more obvious and easy to be understood, the technical solutions of the disclosure will be described below clearly and completely in connection with the accompanying drawings. It is obvious that the described embodiments are only some, but not all the embodiments of the disclosure. All the other embodiments made by those of ordinary skill in the art without the premise of creative work belong to the scope of the disclosure.

Note that in order to depict the relative position relationship of various films more clearly, the bridging part 6 and the compensating electrode 10 are shown transparently in FIGS. 2B, 3B, 4, 5D, 5E, and 5F.

Moreover, in order to depict the relative position relationship of the third via hole 11 and the first via hole 7 more clearly, the size of the third via hole 11 is shown to be smaller than the size of the first via hole 7, but it does not mean the actual proportion of the third via hole 11 and the first via hole 7; and in order to depict the relative position relationship of the fourth via hole 12 and the second via hole 8 more clearly, the size of the fourth via hole 12 is shown to be smaller than the size of the second via hole 8, but it does not mean the actual proportion of the fourth via hole 12 and the second via hole 8.

Embodiment 1

Figure 2A:
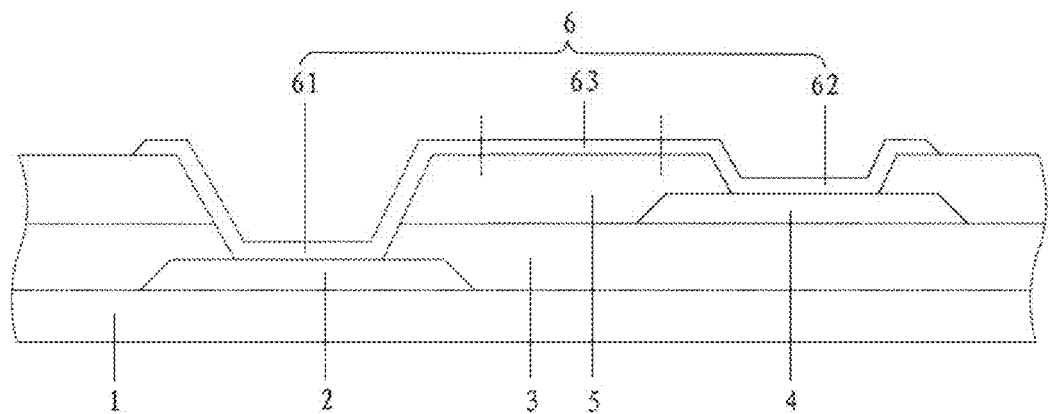
FIG. 2A is a sectional view showing electrically connecting a pattern in a gate electrode layer and a pattern in a source-drain electrode layer on an array substrate according to a first embodiment.
Figure 2B:
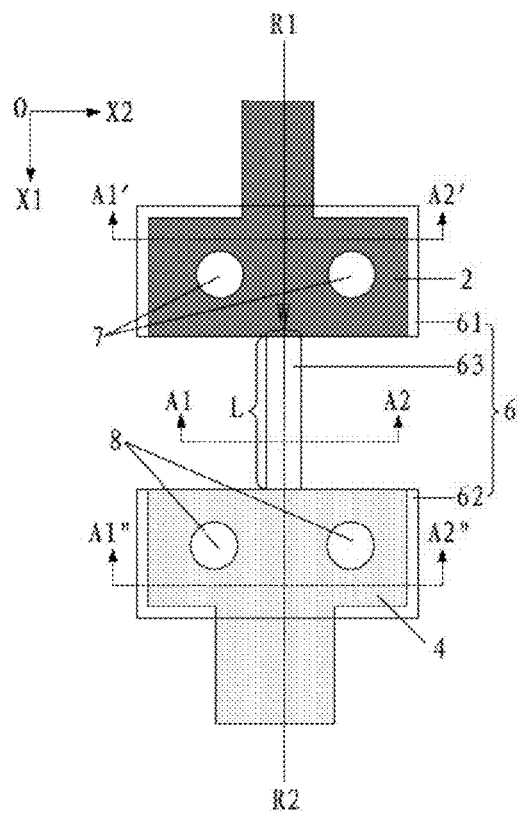
FIG. 2B is a plan view showing electrically connecting a pattern in a gate electrode layer and a pattern in a source-drain electrode layer on an array substrate according to a first embodiment.

This embodiment provides an array substrate as shown in FIGS. 2A and 2B, including a substrate body 1, and a gate electrode layer, a first insulating layer 3, a source-drain electrode layer, a second insulating layer 5 and a transparent conducting layer which are successively layered on the substrate body 1. The gate electrode layer includes a gate connecting part 2, the source-drain electrode layer includes a source-drain connecting part 4, and the transparent conducting layer includes a bridging part 6.

Wherein, the bridging part 6 includes a first electrode 61 which is electrically connected with the gate connecting part 2; a second electrode 62 which is electrically connected with the source-drain connecting part 4; a connecting electrode 63, one end of which is electrically connected with the first electrode 61, the other end is electrically connected with the second electrode 62.

Taking the plane that is perpendicular to the substrate body 1 and successively passes the first electrode 61, the connecting electrode 63 and the second electrode 62 as a reference plane R1R2, the area of a section (i.e., the section along A1A2 direction in FIG. 2B) that the connecting electrode 63 is perpendicular to the substrate body 1 and perpendicular to the reference plane R1R2 is smaller than the area of a section (i.e., the section along A1'A2' direction in FIG. 2B) that the first electrode 61 is perpendicular to the substrate body 1 and perpendicular to the reference plane R1R2, and the area of the section that the connecting electrode 63 is perpendicular to the substrate body 1 and perpendicular to the reference plane R1R2 is smaller than the area of a section (i.e., the section along A1"A2" direction in FIG. 2B) that the second electrode 62 is perpendicular to the substrate body 1 and perpendicular to the reference plane R1R2.

Note that if the bridging part of the prior art for electrically connecting the gate connecting part with the source-drain connecting part is divided, then the bridging part can be divided into three parts: a part covering above the gate connecting part, a part covering above the source-drain connecting part, and a part located between the two, wherein the part covering above the gate connecting part can be referred as the first electrode, the part covering above the source-drain connecting part can be referred as the second electrode, and the part located between the two can be referred as the connecting electrode.

The first electrode 61 of the bridging part 6 of this embodiment is corresponding to the first electrode of the bridging part of the prior art, the second electrode 62 of the bridging part 6 of this embodiment is corresponding to the second electrode of the bridging part of the prior art, and the connecting electrode 63 of the bridging part 6 of this embodiment is corresponding to the connecting electrode of the bridging part of the prior art.

In order to ensure a good electrically connecting between the gate connecting part and the source-drain connecting part, the size of the first electrode 61 of this embodiment can be considered as being same or approximately same as the size of the first electrode of the prior art, the size of the second electrode 62 of this embodiment can be considered as being same or approximately same as the size of the second electrode of the prior art, and because the area of a section along A1A2 direction of the connecting electrode 63 of this embodiment is smaller than both the area of a section along A1'A2' direction of the first electrode 61 and the area of a section along A1"A2" direction of the second electrode 62, the area of a section along A1A2 direction of the connecting electrode 63 of this embodiment can be considered as being smaller than both the area of a section along the corresponding direction (perpendicular to the direction from the first electrode to the second electrode) of the first electrode of the prior art and the area of a section along corresponding direction of the second electrode of the prior art.

Because the transition from the first electrode to the second electrode is usually smooth, the area of a section along the corresponding direction of the connecting electrode of the prior art can be considered as being same or approximately same as the area of a section along the corresponding direction of the first electrode, and being same or approximately same as the area of a section along the corresponding direction of the second electrode, therefore the area of a section along A1A2 direction of the connecting electrode 63 of this embodiment is smaller than the area of a section along the corresponding direction of the connecting electrode of the prior art.

In order to ensure a good electrically connecting between the gate connecting part 2 and the source-drain connecting part 4, the length (the size along the direction perpendicular to the section) of the connecting electrode 63 of this embodiment can be considered as being not smaller than the length (the size along the corresponding direction) of the connecting electrode of the prior art, and we can get that the resistance of the connecting electrode 63 of the present embodiment is greater than the resistance of the connecting electrode of the prior art according to an inverse proportionality relationship between a resistance value of a resistance wire and an area of section of the resistance wire as well as a proportionality relationship between the resistance value of the resistance wire and a length of the resistance wire.

Based on the above derivation, since the size of the first electrode 61 of this embodiment is same or approximately same as the size of the first electrode of the prior art and the size of the second electrode 62 of this embodiment is same or approximately same as the size of the second electrode of the prior art, the resistance of the first electrode 61 of this embodiment is same or approximately same as the resistance of the first electrode 61 of the prior art and the resistance of the second electrode 62 of this embodiment is same or approximately same as the resistance of the second electrode of the prior art, thereby we can get that: a sum of the resistances of the connecting electrode 63, the first electrode 61 and the second electrode 62 of the present embodiment is greater than a sum of the resistances of the connecting electrode, the first electrode and the second electrode of the prior art, i.e., the resistance of the bridging part 6 of the present embodiment is greater than the resistance of the bridging part of the prior art.

In the process of forming the second insulating layer 5 and the bridging part 6, though the electrostatic charges accumulate in the source-drain connecting part 4 such that a potential difference is generated between the source-drain connecting part 4 and the gate connecting part 2, however since the resistance of the bridging part 6 of the present embodiment is relatively large, the blocking effect of the bridging part 6 on the electrostatic charges is enhanced and the flow speed of the electrostatic charges within the connecting part 6 is slowed down, thereby effectively preventing the ESD phenomenon produced in the productive process and improving the reliability of the array substrate.

In order to ensure a good electrically connecting of the first electrode 61 and the gate connecting part 2, the array substrate according to the present embodiment may further include a first via hole 7 which runs through the first insulating layer 3 and the second insulating layer 5 and is located above the gate connecting part 2, wherein the first electrode 61 is electrically connected with the gate connecting part 2 through the first via hole 7. In order to implement a electrically connecting of the second electrode 62 and the source-drain connecting part 4, the array substrate according to the present embodiment may further include a second via hole 8 which runs through the second insulating layer 5 and is located above the source-drain connecting part 4, wherein the second electrode 62 is electrically connected with the source-drain connecting part 4 through the second via hole 8.

In this embodiment, note that in the procedure of setting the resistance value of the bridging part 6, if the set resistance value of the bridge part 6 is too small, it cannot effectively slow down the flow speed of the electrostatic charges and then cannot effectively prevent the occurrence of ESD, and if the set resistance value of the bridge part 6 is too large, it is easy to cause that the electrostatic charges accumulated in the source-drain connecting part 4 cannot be released and a hidden danger within the array substrate is increased, therefore when setting the resistance value of the bridging part 6, it is best to comprehensively consider the following two factors: the requirement of the anti-static capability and the possibly increased hidden danger of a larger resistance value of the bridging part, and set the resistance value of the bridging part 6 within a reasonable scope to maintain a balanced relationship between the above two factors.

The inventors have discovered, by many times of experiments, that the bridging part 6 can both effectively reduce the ESD phenomenon and cause the electrostatic charges accumulated within the source-drain connecting part 4 to be released when the size L of the connecting electrode 63 along a first direction OX1 in the bridging part 6 is 50 μm~10000 μm, and the size W of the connecting electrode 63 along a second direction OX2 is 1 μm~6 μm (the first direction OX1 is parallel to the reference plane R1R2, the second direction OX2 is perpendicular to the reference plane R1R2, and the plane defined by the first direction OX1 and the second direction OX2 is parallel to the substrate body). Moreover, it can realize an optimal balanced relationship between the reduction of ESD and the release of the electrostatic charges when the resistance value of the bridging part 6 is $1\times106\Omega$.

The present embodiment has no specific limit to the shape of the connecting electrode 63, and it can be set as linear to guarantee that the connecting electrode 63 has a smaller area of cross section on the A1A2 direction, that the resistance of the connecting electrode 63 can be effectively increased, and then the resistance of the bridging part 6 can be increased.

Specifically, the connecting electrode 63 can be a rectilinear shape, and the manufacturing difficulty for a rectilinear connecting electrode 63 is relatively low. Or the connecting electrode 63 can be a wavy line shape, a polyline shape or a helix shape and so on, and since the length of the wavy line, the polyline or the helix is relatively long and the resistance of the resistance wire is proportion to the length of the resistance wire, the connecting electrode 63 which has the wavy line shape, the polyline shape or the helix shape is able to generate a relatively large resistance in the case of a shorter distance, thereby capable of shortening the spacing between the first electrode 61 and the second electrode 63, and then capable of shortening the spacing between the gate connecting part 2 and the source-drain connecting part 4 and decreasing the occupied area of the structure for electrically connecting the pattern in the gate electrode layer and the pattern in the source-drain electrode layer.

Figure 1B:
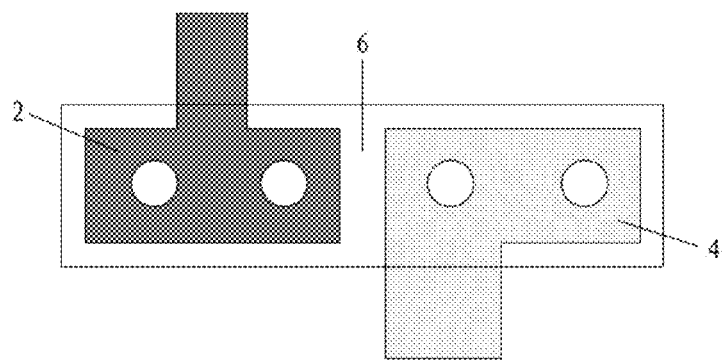
FIG. 1B is a plan view showing electrically connecting a pattern in a gate electrode layer and a pattern in a source-drain electrode layer on an array substrate in the prior art.

In order to significantly increase the resistance of the connecting electrode 63, it can also be realized by changing the relative position of the gate connecting part 2 and the source-drain connecting part 4 or changing the relative position of the two from a side by side arrangement as shown in the FIG. 1B in the prior art to an arrangement along the first direction X1 as shown in the FIG. 2B, thereby increasing the spacing between the gate connecting part 2 and the source-drain connecting part 4, and then increasing the length of the connecting electrode 63 and causing the resistance of the connecting electrode 63 to be increased.

Note that the gate electrode layer of the present embodiment includes in addition to the gate connecting part 2, a gate electrode layer pattern to be connected, which is electrically connected with the gate connecting part 2 and may be a gate electrode and/or a gate line; specifically, the first insulating layer 3 can be a gate electrode insulating layer; an active layer can be arranged between the first insulating layer 3 and the source-drain electrode layer; the source-drain electrode layer includes in addition to the source-drain connecting part 4, a source-drain electrode layer pattern to be connected, which is electrically connected with the source-drain connecting part 4 and can be at least one of a source electrode, a drain electrode and a data line; specifically, the second insulating layer 5 can be a passivating layer; the transparent layer comprises: in addition to the bridging part 6, a pixel electrode or a common electrode.

Embodiment 2

Based on the technology solution according to the first embodiment, a compensating electrode electrically connected with the bridging part 6 is arranged above the bridging part 6 in this embodiment, which enhances the conductivity between the gate connecting part 2 and the source-drain connecting part 4 and compensates a loss of the conductivity between the gate connecting part 2 and the source-drain connecting part 4 incurred by an increase of the resistance of the bridging part 6 after the electrostatic charges in the source-drain connecting part 4 is released.

Figure 3A:
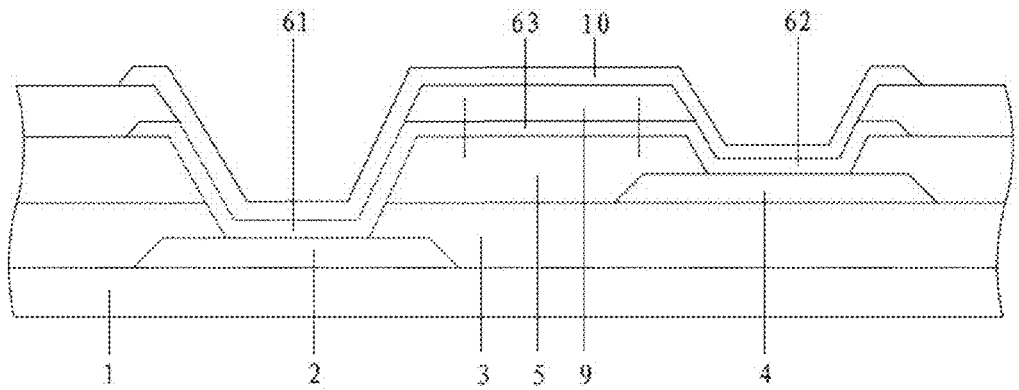
FIG. 3A is a sectional view showing electrically connecting a pattern in a gate electrode layer and a pattern in a source-drain electrode layer on an array substrate according to a second embodiment.
Figure 3B:
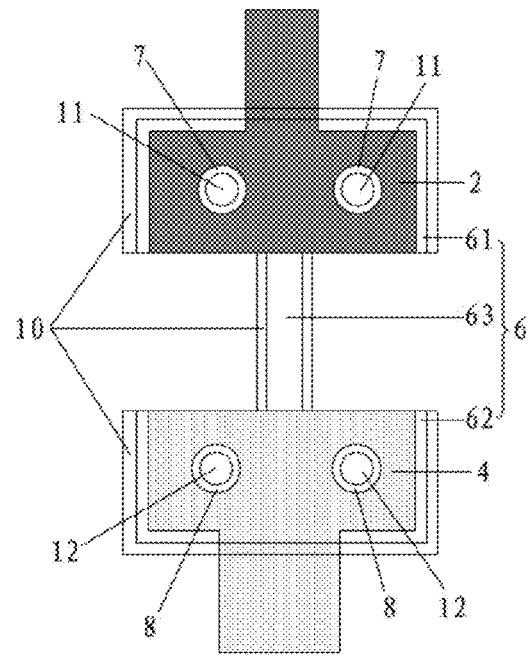
FIG. 3B is a plan view showing electrically connecting a pattern in a gate electrode layer and a pattern in a source-drain electrode layer on an array substrate according to a second embodiment.

Specifically, as shown in FIGS. 3A and 3B, the array substrate of the present embodiment further includes a third insulating layer 9 covering the transparent conducting layer; a third via hole 11 which runs through the third insulating layer 9 and is located above the first electrode 61; a fourth via hole 12 which runs through the third insulating layer 9 and is located above the second electrode 62; a compensating electrode 10 located on the third insulating layer 9, wherein one end of the compensating electrode 10 is electrically connected with the first electrode 61 through the third via hole 11, and the other end is electrically connected with the second electrode 62 through the fourth via hole 12.

In the above technology solution, it can enhance the conductivity between the gate connecting part 2 and the source-drain connecting part 4 by arranging the third insulating layer 9 on the transparent conducting layer, then arranging the compensating electrode 10 on the third insulating layer 9, and electrically connecting the compensating electrode 10 with the first electrode 61 and the second electrode 62, thereby the elements for electrically connecting the gate connecting part 2 with the source-drain connecting part 4 including the bridging part 6 and the compensating electrode 10.

Note that the addition of the compensating electrode 10 will not incur the ESD phenomenon, and this is because that in the productive process of the array substrate, the electrostatic charges accumulate in the source-drain connecting part 4 when forming the second insulating layer 5, then the bridging part 6 cause the gate connecting part 2 to be electrically connected with the source-drain connecting part 4 in the procedure of forming the bridging part 6, thereby slowing down the release of the electrostatic charges. Therefore before forming the compensating electrode 10, the electrostatic charges already do not exist within the source-drain connecting part 4, and it also will not incur the ESD phenomenon even if the compensating electrode 10 enhances the conductivity between the gate connecting part 2 and the source-drain connecting part 4.

In the present embodiment, the materials for forming the compensating electrode 10 may be the conductive materials with low resistance, for example, metal materials, ITO (Indium Tin Oxide) materials and so on, to enhance the conductivity between the gate connecting part 2 and the source-drain connecting part 4 much better.

The shape of the compensating electrode 10 may be consistent with the shape of the bridging part 6, and in order to enhance the conductivity between the gate connecting part 2 and the source-drain connecting part 4, the width (i.e., the size along the direction perpendicular to the reference plane) of a part of the compensating electrode 10 covering above the connecting electrode 63 can be increased to decrease the resistance of the compensating electrode 10.

Embodiment 3

In the present embodiment, based on the first embodiment, a part of the source-drain electrode layer pattern to be connected in the source-drain electrode layer is used as the source-drain connecting part, or a part of the gate electrode layer pattern to be connected in the gate electrode layer is used as the gate connecting part, to decrease the occupied area of the structure for electrically connecting the pattern in the gate electrode layer and the pattern in source-drain electrode layer, and simplify the structure of the array substrate.

Figure 4:
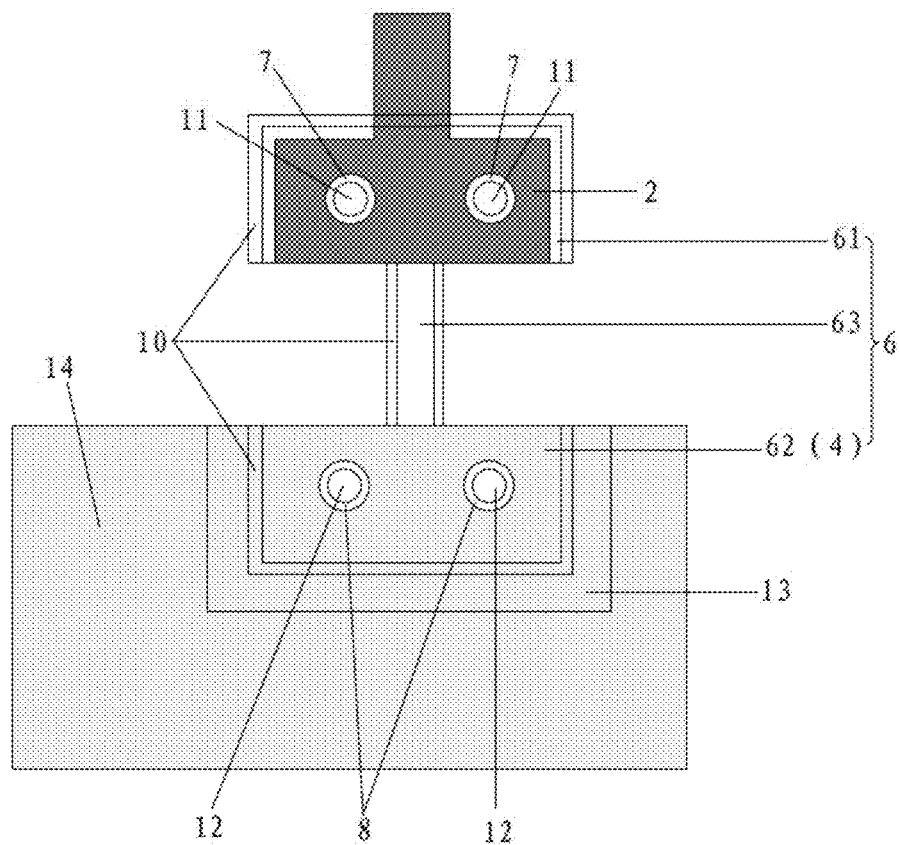
FIG. 4 is a plan view showing electrically connecting a pattern in a gate electrode layer and a pattern in a source-drain electrode layer on an array substrate according to a third embodiment.

Specifically, the solution for a part of the source-drain electrode layer pattern to be connected being used as the source-drain connecting part may be that: as shown in FIG. 4, the source-drain electrode layer further includes a source-drain electrode layer pattern to be connected 13, which includes a source electrode, a drain electrode and a data line, and the second via hole 8 is located above the source-drain electrode layer pattern to be connected 13, the source-drain connecting part 4 is a part that is located under the second via hole 8 and surrounding area thereof in the source-drain electrode layer pattern to be connected 13, and specifically, the part covered by the second electrode 62 may be used as the source-drain connecting part 4. By the above mentioned technology solution that the source-drain connecting part 4 is integrated into the source-drain electrode layer pattern to be connected 13, it can omit the manufacturing of the pattern of the source-drain connecting part 4, thereby saving the occupied area of the source-drain connecting part 4 and simplifying the structure of the array substrate.

Specifically, the solution for a part of the gate electrode layer pattern to be connected being used as the gate connecting part may be that: the gate electrode layer further includes a gate electrode layer pattern to be connected, which includes a gate electrode and a gate line, and the first via hole is located above the gate electrode layer pattern to be connected, the gate connecting part is a part that is located under the first via hole and surrounding area thereof in the gate electrode layer pattern to be connected, and specifically, the part covered by the first electrode 61 may be used as the gate connecting part. By the above mentioned technology solution that the gate connecting part is integrated into the gate electrode layer pattern to be connected, it can omit the manufacturing of the pattern of the gate connecting part, thereby saving the occupied area of the gate connecting part and simplifying the structure of the array substrate.

In the present embodiment, the compensating electrode 10 which is electrically connected with the bridging part 6 can also be arranged above the bridging part 6, which is used for enhancing the conductivity between the gate connecting part 2 and the source-drain connecting part 4.

The materials for forming the compensating electrode 10 may be the metal materials with good conductivity, and the compensating electrode 10 can be formed in a same layer with a metal layer 14 in addition to the gate electrode layer and the source-drain electrode layer on the array gate when forming the compensating electrode 10, so as not to add a further step for forming the compensating electrode 10.

Embodiment 4

Figure 5A:
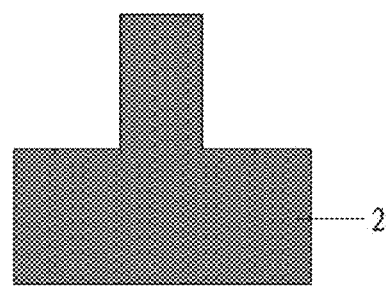
FIGS. 5A-5F show a diagram of steps of a manufacturing method of an array substrate according to a fourth embodiment.
Figure 5B:
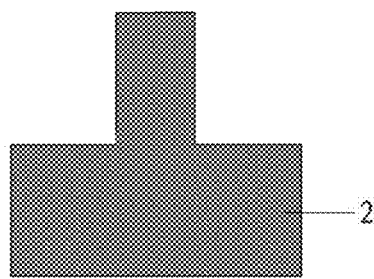
Figure 5B:
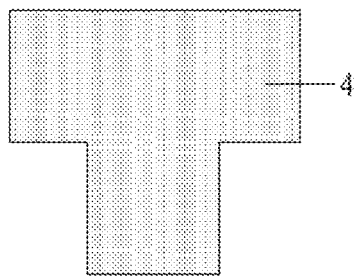

The present embodiment provides a manufacturing method of an array substrate, include, as shown in FIGS. 5A and 5B, forming a gate electrode layer, a first insulating layer, a source-drain electrode layer, and a second insulating layer by successively layering them on a substrate body, wherein the gate electrode layer includes a gate connecting part 2, the source-drain electrode layer includes a source-drain connecting part 4 (note that the first insulating layer and the second insulating layer are both whole transparent films, therefore the first insulating layer and the second insulating layer are not shown in FIGS. 5A-5F).

The manufacturing method further includes forming a transparent conducting layer on the second insulating layer, wherein the transparent conducting layer includes a bridging part 6, wherein the bridging part 6 includes a first electrode 61 which is electrically connected with the gate connecting part 2; a second electrode 62 which is electrically connected with the source-drain connecting part 4; and a connecting electrode 63, one end of which is electrically connected with the first electrode 61, the other end is electrically connected with the second electrode 62.

Taking the plane that is perpendicular to the substrate body and successively passes the first electrode 61, the connecting electrode 63 and the second electrode 62 as a reference plane, the area of a section that the connecting electrode 63 is perpendicular to the substrate body and perpendicular to the reference plane is smaller than the area of a section that the first electrode 61 is perpendicular to the substrate body and perpendicular to the reference plane, and the area of the section that the connecting electrode 63 is perpendicular to the substrate body and perpendicular to the reference plane is smaller than the area of a section that the second electrode 62 is perpendicular to the substrate body and perpendicular to the reference plane.

By adopting the above manufacturing method of the array substrate, the area of a section that the connecting electrode 63 is perpendicular to the substrate body and perpendicular to the reference plane is smaller than both the area of a section that the first electrode 61 is perpendicular to the substrate and perpendicular to the reference plane and the area of a section that the second electrode 62 is perpendicular to the substrate body and perpendicular to the reference plane, therefore it can increase the resistance of the connecting electrode 63 according to an inverse proportionality relationship between a resistance value of a resistance wire and an area of section of the resistance wire, and then increase the resistance of the whole bridging part 6, enhance the blocking effect of the bridging part 6 on the electrostatic charges, slow down the flow speed of the electrostatic charges within the bridging part 6, and effectively prevent the ESD phenomenon produced in the productive process.

Figure 5C:
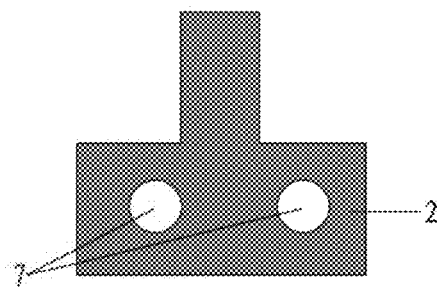
Figure 5C:
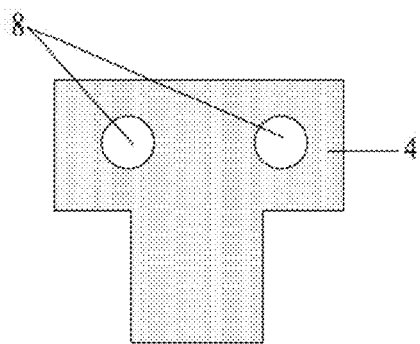
Figure 5D:
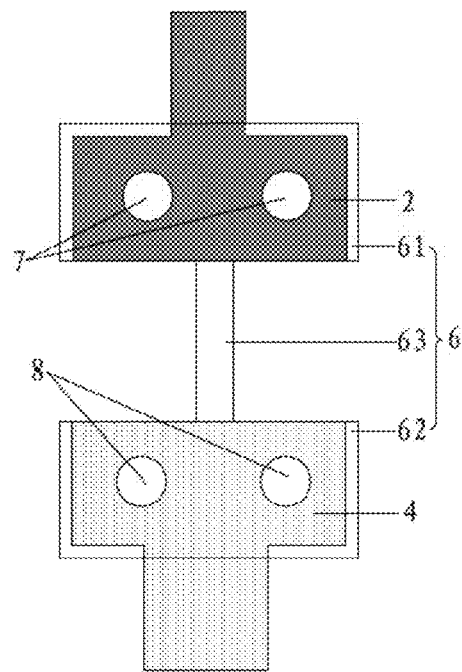

In order to realize that the first electrode 61 is electrically connected with the gate connecting part 2 and the second electrode 62 is electrically connected with the source-drain connecting part 4, after forming the second insulating layer and before forming the transparent conducting layer, the manufacturing method According to the present embodiment further includes, as shown in FIG. 5C, forming a first via hole 7 and a second via hole 8, wherein the first via hole 7 runs through the first insulating layer and the second insulating layer and is located above the gate connecting part 2 such that the subsequently formed first electrode 61 is electrically connected with the gate connecting part 2 through the first via hole 7, and the second via hole 8 runs through the second insulating layer and is located above is located above the source-drain connecting part such that the subsequently formed second electrode 62 is electrically connected with the source-drain connecting part 4 through the second via hole 8.

In the present embodiment, the source-drain electrode layer further includes a source-drain electrode layer pattern to be connected, which includes a source electrode, a drain electrode and a data line, and in order to decrease the occupied area of the structure for electrically connecting the pattern in the gate electrode layer and the pattern in the source-drain electrode layer and simplify the structure of the array substrate, a part of the source-drain electrode layer pattern to be connected may be used as the source-drain connecting part 4, and the specific procedure for forming the second via hole 8 may be that: forming the second via hole 8 above the source-drain electrode layer pattern to be connected to use a part which is located under the second via hole 8 and surrounding area thereof in the source-drain electrode layer pattern to be connected as the source-drain connecting part 4.

The gate electrode layer may further include a gate electrode layer pattern to be connected, which includes a gate electrode and a gate line, and in order to decrease the occupied area of the structure for electrically connecting the pattern in the gate electrode layer and the pattern in the source-drain electrode layer and simplify the structure of the array substrate, a part of the gate electrode layer pattern to be connected in the gate electrode layer is used as the gate connecting part 2, and the specific procedure for forming the first via hole 7 may be that: forming the first via hole 7 above the gate electrode layer pattern to be connected to use a part which is located under the first via hole 7 and surrounding area thereof in the gate electrode layer pattern to be connected as the gate connecting part 2.

Figure 5E:
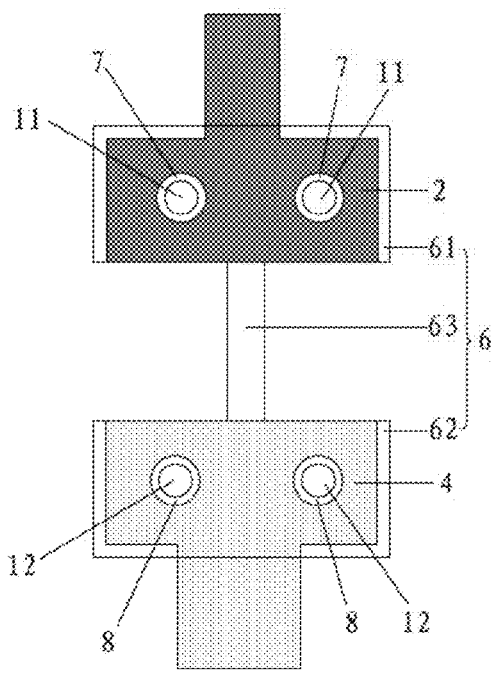
Figure 5F:
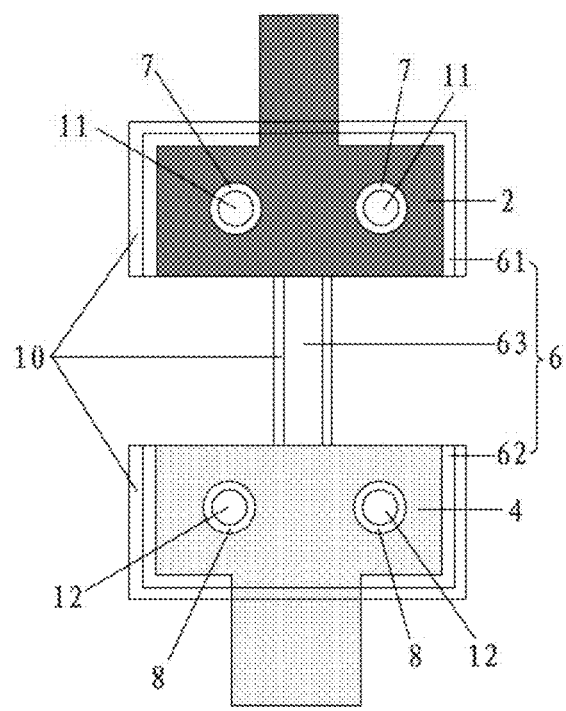

The manufacturing method according to the present embodiment may further include, as shown in FIGS. 5E and 5F, covering a third insulating layer on the transparent conducting layer; forming a third via hole 11 and a fourth via hole 12, wherein the third via hole 11 runs through the third insulating layer and is located above the first electrode 61, and the fourth via hole 12 runs through the third insulating layer and is located above the second electrode 62; forming a compensating electrode 10 on the third insulating layer, wherein one end of the compensating electrode 10 is electrically connected with the first electrode 61 through the third via hole 11, and the other end is electrically connected with the second electrode 62 through the fourth via hole 12. Since the compensating electrode 10 is electrically connected with the first electrode 61 and the second electrode 62, the elements for electrically connecting the gate connecting part 2 with the source-drain connecting part 4 comprise both the bridging part 6 and the compensating electrode 10, thereby enhancing the conductivity between the gate connecting part 2 and the source-drain connecting part 4, compensating the loss of the conductivity between the gate connecting part 2 and the source-drain connecting part 4 incurred by an increase of the resistance of the bridging part 6 to prevent the ESD phenomenon when forming the bridging part 6.

Embodiment 5

The present embodiment provides a display device including the array substrate according to the first through third embodiments. Since the resistance of the bridging part for electrically connecting the gate connecting part with the source-drain connecting part in the array substrate of the first through third embodiments is relatively large and can slow down the flow speed of the electrostatic charges in the bridging part, it can decrease the probability of the ESD phenomenon generated in the productive process of the array substrate, and enhance the reliability of the array substrate, therefore the reliability of the display device comprising the array substrate according to the first through third embodiments is relatively high.

Note that the display device according to the present embodiment can be any product or component capable of displaying function, such as a liquid crystal display panel, an electronic paper, an OLED (Organic Light-Emitting Diode) panel, a cell phone, a tablet, a television, a display, a laptop, a digital photo frame, a navigator and so on.

The above mentioned embodiments are only example embodiments of the disclosure, however the present invention is not limited to thereto, and various variation and replacement which are easy to be made by those skilled in the art within the technology scope disclosed herein should be encompassed within the scope of the disclosure. Therefore, the scope of the present invention should be defined by the claims.

What is claimed is:
1. An array substrate comprising:
a substrate body;
a gate electrode layer, a first insulating layer, a source-drain electrode layer, and a second insulating layer, and a transparent conducting layer which are successively layered on the substrate body, wherein the gate electrode layer includes a gate connecting part, wherein the source-drain electrode layer includes a source-drain connecting part, and wherein the transparent conducting layer includes a bridging part;
wherein said bridging part comprises:
a first electrode which is electrically connected to the gate connecting part;
a second electrode which is electrically connected to the source-drain connecting part; and
a connecting electrode comprising a first end electrically connected to the first electrode and a second end electrically connected to the second electrode;
wherein a reference plane is defined perpendicular to the substrate body and passing through the first electrode, the connecting electrode, and the second electrode; and
wherein a cross-sectional area of the connecting electrode that is taken perpendicular to the reference plane and taken perpendicular to the substrate body is i) smaller than a cross-sectional area of the first electrode that is taken perpendicular to the reference plane and taken perpendicular to the substrate body and ii) smaller than a cross-sectional area of the second electrode that is taken perpendicular to the reference plane and taken perpendicular to the substrate body;
a third insulating layer covering the transparent conducting layer,
a third via hole extending through the third insulating layer and located above the first electrode;
a fourth via hole extending through the third insulating layer and located above the second electrode; and
a compensating electrode located on the third insulating layer, wherein a first end of the compensating electrode is electrically connected to the first electrode through the third via hole, and wherein a second end of the compensating electrode is electrically connected to the second electrode through the fourth via hole.

2. The array substrate according to claim 1, further comprising:
a first via hole extending through the first insulating layer and the second insulating layer and located above the gate connecting part, wherein the first electrode is electrically connected to the gate connecting part through the first via hole; and
a second via hole extending through the second insulating layer and located above the source-drain connecting part, wherein the second electrode is electrically connected to the source-drain connecting part through the second via hole.

3. The array substrate according to claim 2, wherein the source-drain electrode layer further comprises a source-drain electrode layer pattern that comprises a source electrode, a drain electrode, and a data line, wherein the second via hole is located above the source-drain electrode layer pattern, and wherein the source-drain connecting part is located under the second via hole in the source-drain electrode layer pattern.

4. The array substrate according to claim 2, wherein the gate electrode layer further comprises a gate electrode layer pattern that includes a gate electrode and a gate line, wherein the first via hole is located above the gate electrode layer pattern, and wherein the gate connecting part is located under the first via hole and in the gate electrode layer pattern.

5. The array substrate according to claim 3, wherein the gate electrode layer further comprises a gate electrode layer pattern that includes a gate electrode and a gate line, wherein the first via hole is located above the gate electrode layer pattern, and wherein the gate connecting part is located under the first via hole and in the gate electrode layer pattern.

6. The array substrate according to claim 1, wherein the connecting electrode has a length of approximately 50 μm to 10000 μm, and wherein the connecting electrode has a width of approximately 1 μm to 6 μm.

7. A display device comprising the array substrate of claim 1.

8. A method of manufacturing an array substrate, the method comprising:
- successively layering, on a substrate body, a gate electrode layer, a first insulating layer, a source-drain electrode layer, and a second insulating layer, wherein the gate electrode layer includes a gate connecting part, and wherein the source-drain electrode layer includes a source-drain connecting part;
- forming a transparent conducting layer on the second insulating layer, wherein the transparent conducting layer includes a bridging part, wherein the bridging part includes a first electrode which is electrically connected to the gate connecting part, a second electrode which is electrically connected to the source-drain connecting part, and a connecting electrode including a first end electrically connected to the first electrode and a second end electrically connected to the second electrode;
- wherein a reference plane is defined perpendicular to the substrate body and passing through the first electrode, the connecting electrode, and the second electrode; and
- wherein a cross-sectional area of the connecting electrode that is taken perpendicular to the reference plane and taken perpendicular to the substrate body is i) smaller than a cross-sectional area of the first electrode that is taken perpendicular to the reference plane and taken perpendicular to the substrate body and ii) smaller than a cross-sectional area of the second electrode that is taken perpendicular to the reference plane and taken perpendicular to the substrate body;
- covering a third insulating layer on the transparent conducting layer;
- forming a third via hole and a fourth via hole, wherein the third via hole extends through the third insulating layer and is located above the first electrode, and wherein the fourth via hole extends through the third insulating layer and is located above the second electrode; and
- forming a compensating electrode on the third insulating layer, wherein a first end of the compensating electrode is electrically connected to the first electrode through the third via hole, and wherein a second end is electrically connected to the second electrode through the fourth via hole.

9. The method according to claim 8, wherein after forming the second insulating layer and before forming the transparent conducting layer, the method further comprises:
- forming a first via hole and a second via hole, wherein the first via hole extends through the first insulating layer and the second insulating layer and is located above the gate connecting part such that the first electrode is electrically connected to the gate connecting part through the first via hole, and wherein the second via hole extends through the second insulating layer and is located above the source-drain connecting part such that the second electrode is electrically connected to the source-drain connecting part through the second via hole.

10. The method according to claim 9, wherein the source-drain electrode layer further includes a source-drain electrode layer pattern that includes a source electrode, a drain electrode and a data line, and wherein forming the second via hole comprises forming the second via hole above the source-drain electrode layer pattern such that the source-drain connecting part is located under the second via hole and in the source-drain electrode layer pattern.

11. The method according to claim 9, wherein the gate electrode layer further includes a gate electrode layer pattern that includes a gate electrode and a gate line, and wherein forming the first via hole comprises forming the first via hole above the gate electrode layer pattern such that the gate connecting part is located under the first via hole and in the gate electrode layer pattern.

12. The method according to claim 10, wherein the gate electrode layer further includes a gate electrode layer pattern that includes a gate electrode and a gate line, and wherein forming the first via hole comprises forming the first via hole above the gate electrode layer pattern such that the gate connecting part is located under the first via hole and in the gate electrode layer pattern.

13. The method according to claim 8, further comprising:
- covering a third insulating layer on the transparent conducting layer;
- forming a third via hole and a fourth via hole, wherein the third via hole extends through the third insulating layer and is located above the first electrode, and wherein the fourth via hole extends through the third insulating layer and is located above the second electrode; and
- forming a compensating electrode on the third insulating layer, wherein a first end of the compensating electrode is electrically connected to the first electrode through the third via hole, and wherein a second end is electrically connected to the second electrode through the fourth via hole.

\* \* \* \* \*